US007282894B2

United States Patent
Oswald et al.

(10) Patent No.: US 7,282,894 B2
(45) Date of Patent: Oct. 16, 2007

(54) METHOD AND APPARATUS FOR PERFORMING LOSSLESS SENSING AND NEGATIVE INDUCTOR CURRENTS IN A HIGH SIDE SWITCH

(75) Inventors: Richard K. Oswald, San Jose, CA (US); Tamotsu Yamamoto, Cupertino, CA (US); Takashi Ryu, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 24 days.

(21) Appl. No.: 11/207,937

(22) Filed: Aug. 22, 2005

(65) Prior Publication Data

US 2006/0044843 A1    Mar. 2, 2006

Related U.S. Application Data

(60) Provisional application No. 60/604,014, filed on Aug. 25, 2004.

(51) Int. Cl.
*G05F 1/613* (2006.01)

(52) U.S. Cl. .................. 323/224; 323/282; 323/284; 363/25

(58) Field of Classification Search ............... 323/272, 323/224, 271, 268, 282–290
See application file for complete search history.

(56) References Cited

U.S. PATENT DOCUMENTS

| | | | |
|---|---|---|---|
| 4,378,530 A | 3/1983 | Garde | |
| 4,727,308 A | 2/1988 | Huljak et al. | |
| 4,943,902 A | 7/1990 | Severinsky | |
| 4,959,606 A | 9/1990 | Forge | |
| 5,305,192 A | 4/1994 | Bonte et al. | |
| 5,479,090 A | 12/1995 | Schultz | |
| 5,600,234 A | 2/1997 | Hastings et al. | |
| 5,903,447 A | 5/1999 | Takahashi et al. | |
| 5,905,407 A | 5/1999 | Midya | |
| 5,929,620 A | 7/1999 | Dobkin et al. | |
| 5,949,229 A | 9/1999 | Choi et al. | |
| 5,982,160 A | 11/1999 | Walters et al. | |
| 6,034,517 A | 3/2000 | Schenkel | |
| 6,046,516 A | 4/2000 | Maier et al. | |
| 6,066,943 A | 5/2000 | Hastings et al. | |
| 6,166,528 A | 12/2000 | Rossetti et al. | |
| 6,222,356 B1 | 4/2001 | Taghizadeh-Kaschani | |
| 6,268,756 B1 | 7/2001 | Nayebi et al. | |
| 6,307,356 B1 | 10/2001 | Dwelley | |
| 6,313,610 B1 | 11/2001 | Korsunsky | |
| 6,366,070 B1 | 4/2002 | Cooke et al. | |
| 6,404,261 B1 | 6/2002 | Grover et al. | |

(Continued)

*Primary Examiner*—Rajnikant B. Patel
(74) *Attorney, Agent, or Firm*—McDermott Will & Emery LLP

(57) ABSTRACT

A current sensing circuit for use in a switching regulator having a high-side switch. The current sensing circuit includes a first sensing circuit coupled to the high-side switch for measuring current flowing in a positive direction through the high-side switch. The first sensing circuit includes a first replica device for generating a current which is a scaled version of the positive current flowing through the high-side switch. The current sensing circuit further includes a second sensing circuit coupled to the high-side switch for measuring current flowing in a negative direction through the high-side switch. The second sensing circuit includes a second replica device for generating a current which is a scaled version of the negative current flowing through the high-side switch.

16 Claims, 5 Drawing Sheets

U.S. PATENT DOCUMENTS

| | | |
|---|---|---|
| 6,476,589 B2 | 11/2002 | Umminger et al. |
| 6,498,466 B1 | 12/2002 | Edwards |
| 6,509,721 B1 | 1/2003 | Liebler |
| 6,522,178 B2 | 2/2003 | Dubhashi et al. |
| 6,541,947 B1 | 4/2003 | Dittmer et al. |
| 6,611,131 B2 | 8/2003 | Edwards |
| 6,724,174 B1 | 4/2004 | Esteves et al. |
| 6,744,241 B2 | 6/2004 | Feldtkeller |
| 6,765,372 B2 * | 7/2004 | Isham ........................ 323/224 |
| 6,828,766 B2 | 12/2004 | Corva et al. |
| 6,873,140 B2 | 3/2005 | Saggini et al. |
| 6,894,471 B2 | 5/2005 | Corva et al. |
| 7,030,596 B1 | 4/2006 | Salerno et al. |
| 2003/0025484 A1 | 2/2003 | Edwards |

* cited by examiner

METHOD AND APPARATUS FOR PERFORMING LOSSLESS SENSING AND NEGATIVE INDUCTOR CURRENTS IN A HIGH SIDE SWITCH

CLAIM OF PRIORITY

This patent application, and any patent(s) issuing therefrom, claim priority to U.S. provisional patent application No. 60/604,014, filed on Aug. 25, 2004, which is incorporated herein by reference in its entirety.

FIELD OF THE INVENTION

The present invention relates to a method and apparatus for performing substantially lossless sensing of positive and negative inductor currents in a high-side switch, which may be utilized, for example, in a current mode switching regulator.

BACKGROUND OF INVENTION

The use of current mode switching regulators as a means of providing a predetermined and substantially constant output voltage to a variable load from a fluctuating voltage source is well known. FIG. 1 illustrates an example of the use of a high-side switch 12 in a trailing edge modulation current mode switching regulator. As shown in FIG. 1, the circuit 1 includes a controller 10 having a first output coupled to the high-side switch 12 and a second output coupled to a low-side switch 14. The circuit further includes inductor L having one end coupled to the drains of the high-side switch 12 and low-side switch 14, and the other end coupled to a load capacitor C, where the voltage across the capacitor represents VOUT (i.e., the voltage supplied to the load). The output voltage, VOUT, is also fed-back and compared to a reference voltage, $V_{REF}$, with the difference between the two being fed to a second input of the controller 10.

The circuit illustrated in FIG. 1 can be utilized, for example, in essentially any "trailing edge modulation" switching regulator that terminates the high side switch "on" interval based on inductor current, and initiates the high-side switch "on" interval by a clock for fixed frequency operation, or by a timer for predetermined "off" time operation.

FIG. 2 illustrates, in detail, a prior art version of the high-side switch 12 of FIG. 1 in a circuit which provides for sensing of the current $I_L$ flowing through the inductor L. As shown in FIG. 2, the high-side switch 12 comprises a PMOS transistor 12a and an inherent body diode 12b. The source and drain terminals of the high-side switch 12 are coupled to the inputs of a sense amplifier 24, which operates to generate an output representing the current flowing through the high-side switch 12. The output of the sense amplifier 24 is represented as $I_{SENSE} = I_{SWITCH} \times R_{ON} \times Gm$, where $I_{SWITCH}$ corresponds to the current flowing through the high-side switch 12, $R_{ON}$ corresponds to the "ON" resistance of switch 12 and Gm corresponds to the transconductance of amplifier 24. The remaining components of the circuit are the same as shown in FIG. 1.

In operation, the circuit illustrated in FIG. 2 functions to sense the voltage drop across the high-side switch 12 when it is "ON" and generate the current signal, $I_{SENSE}$. The circuit of FIG. 2 works reasonably well with MOS switches having an approximately linear "ON" resistance regardless of the magnitude or direction of the switch current, $I_{SWITCH}$. However, the "ON" resistance of the switch has significant variations from unit to unit as well as with temperature, etc., which can result in unacceptable variations in performance. In order to overcome these variations, it has been known to utilize a matching or replica device having a scaled but tracking value of $R_{ON}$ as shown in FIG. 3.

Referring to FIG. 3, the circuit includes the high-side switch 12, inductor L and load capacitor C coupled in the same manner as shown in FIG. 2 above. The circuit further includes a replica switch 32, a sense amplifier 34 and an auxiliary device 36, which are coupled within the circuit as follows. The replica switch 32, which in the given embodiment is a PMOS switch, is configured so as to have the same drive signals as the high-side switch 12. As shown, the source terminal of both the replica device 32 and the high-side switch 12 are coupled to the supply voltage 31, and the gate terminal of both the replica device 32 and the high-side switch 12 receive the same input signal. The drain terminal of the high-side switch 12 is coupled to the non-inverting terminal of the sense amplifier 34 and the drain terminal of the replica device 32 is coupled to the inverting terminal of the sense amplifier 34. The drain terminal of the replica device 32 is also coupled to the source terminal of the auxiliary device 36, which in the given embodiment is a PMOS switch. The gate of auxiliary device 36 receives the output of the sense amplifier 34 as an input signal, and the source terminal of switch 36 generates an output signal $I_{SENSE}$, which is equal to $K^* I_{SWITCH}$, where K is equal to the scaling factor of the replica device 32.

By using a replica device 32 which exhibits a reduced area relative to the high-side switch 12 (i.e., scaling the replica device), it is possible to substantially negate the variations in $R_{ON}$. As shown in FIG. 3, the value of $R_{ON}$ is increased by a factor of K, which is the scaling factor. As an example, a scaling factor on the order of 1/1000 may be utilized. In operation, utilizing the foregoing feedback configuration, the sense amplifier 34 operates to maintain the voltage across the replica device 32 equal to the voltage across the high-side switch 12. When $I_{SWITCH}$ is positive, the sense amplifier 34 functions to turn on the auxiliary device 36, and the auxiliary device outputs the $I_{SENSE}$ signal. Thus, when $I_{SWITCH}$ is positive (i.e., current flowing from $V_{SUPPLY}$ to the load), $I_{SENSE}$, which is a scaled version of $I_{SWITCH}$, is flowing through the replica device 32 and the auxiliary device 36. It is noted that the $I_{SENSE}$ signal is typically coupled to the controller 10 which governs the overall operation of the switching regulator.

However, in the event that the current flowing through the high-side switch 12 becomes negative (i.e., current flowing from the load back to $V_{SUPPLY}$), the drain of the high-side switch 12 becomes positive relative to the source of the high-side switch 12, which causes the non-inverting terminal of the sense amplifier 34 to be positive relative to the inverting terminal of the sense amplifier 34. As a result, the sense amplifier 34 generates an output signal which causes the auxiliary device 36 to turn off, thereby turning off the $I_{SENSE}$ signal.

Thus, while the circuit of FIG. 3 is acceptable for use when the current flowing through the high-side switch is positive, it is not capable of handling both positive and negative current flow through the high-side switch. As such, the circuit of FIG. 3 cannot be utilized, for example, in a switching regulator operating in a synchronously rectified current mode where $I_{SWITCH}$ is negative because the low side switch has been kept "ON" in order to lower the output voltage with current "negative I", which recirculates as negative $I_{SWITCH}$ when the low side switch turns OFF.

Accordingly, there exists a need for both a method and an apparatus which allows for the negation of the effects of variations and fluctuations in $R_{ON}$ in the high-side switch and which allows for substantially loss-less sensing of the current flowing though the high-side switch in both a positive and negative direction.

SUMMARY OF THE INVENTION

In view of the foregoing, it is a primary objective of the invention to solve the foregoing problems and provide a method and apparatus that allows for the negation of the effects of variations and fluctuations in $R_{ON}$ in the high-side switch and which allows for substantially loss-less sensing of the current flowing though the high-side switch in both a positive and negative direction.

According to one embodiment, the present invention relates to a current sensing circuit for use in a switching regulator having a high-side switch. The current sensing circuit includes a first sensing circuit coupled to the high-side switch for measuring current flowing in a positive direction through the high-side switch. The first sensing circuit includes a first replica device for generating a current which is a scaled version of the positive current flowing through the high-side switch. The current sensing circuit further includes a second sensing circuit coupled to the high-side switch for measuring current flowing in a negative direction through the high-side switch. The second sensing circuit includes a second replica device for generating a current which is a scaled version of the negative current flowing through the high-side switch.

In accordance with another embodiment, the present invention relates to a switching regulator for regulating an output voltage. The switching regulator includes a high-side switch; a low-side switch; a controller coupled to the high-side switch and the low-side switch for governing the operational state of the high-side switch and the low-side switch during operation of the switching regulator. The switch regulator further includes a current measuring circuit having a first sensing circuit coupled to the high-side switch for measuring current flowing in a positive direction through the high-side switch, where the first sensing circuit includes a first replica device for generating a current which is a scaled version of the positive current flowing through the high-side switch, and a second sensing circuit coupled to the high-side switch for measuring current flowing in a negative direction through the high-side switch, where the second sensing circuit includes a second replica device for generating a current which is a scaled version of the negative current flowing through the high-side switch.

The switching regulator of the present invention provides numerous advantages over the prior art. One advantage of the present invention is that it provides for substantially loss-less sensing of the current flowing in the high-side switch regardless of whether the current is flowing in a positive or negative direction. It is noted that the current sensing is performed in a substantially "loss less" manner because the sensing element utilizes a scaled MOS transistor as a sensing element, which has a much smaller current than the switch current.

Another advantage of the present invention is that it provides for improved efficiency as the current mode switching regulator allows for the sense amplifier associated with measuring negative current flow to be disabled during periods of positive current flow.

Yet another advantage is that the current mode switching regulator of the present invention provides a means of accurately measuring the peak inductor current at a single point internal to an integrated circuit (i.e., the high-side driver) without a sense resistor (which would need to be external) and its losses or the power losses of an always on negative current sensor which is seldom needed in usual operation.

Additional objects, advantages, and novel features of the invention will become apparent to those skilled in the art upon examination of the following description, or may be learned by practice of the invention. While the novel features of the invention are set forth below, the invention, both as to organization and content, will be better understood and appreciated, along with other objects and features thereof, from the following detailed description taken in conjunction with the drawings.

BRIEF DESCRIPTION OF THE DRAWINGS

The accompanying drawings, which are incorporated into and form a part of the specification, illustrate several aspects and embodiments of the present invention and, together with the general description given above and detailed description given below, serve to explain the principles of the invention. Such description makes reference to the annexed drawings. The drawings are only for the purpose of illustrating preferred embodiments of the invention and are not to be treated as limiting the invention.

In the drawings.

Throughout the above-mentioned drawings, identical reference numerals are used to designate the same or similar component parts.

DESCRIPTION OF THE INVENTION

The present invention will now be described more fully hereinafter with reference to the accompanying drawings, in which preferred embodiments of the invention are shown. This invention may, however, be embodied in many different forms and should not be construed as limited to the embodiments set forth herein rather, these embodiments are provided so that this disclosure will be thorough and complete, and will fully convey the scope of the invention to those skilled in the art, like numbers refer to like elements throughout.

Figure 3:
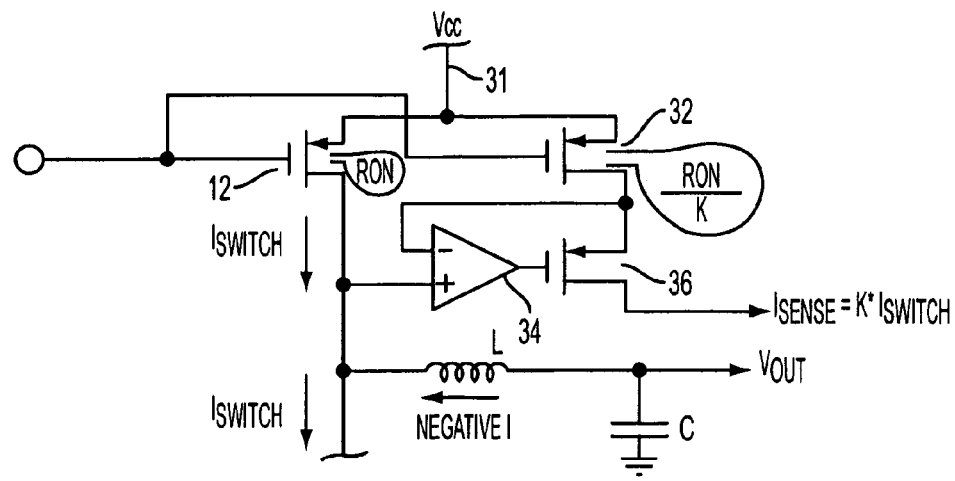
FIG. 3 illustrates a known technique of utilizing a matching or replica device in conjunction with the high-side switch in order to minimize measurement errors due to variations in "ON" resistance of the high-side switch.
Figure 4:
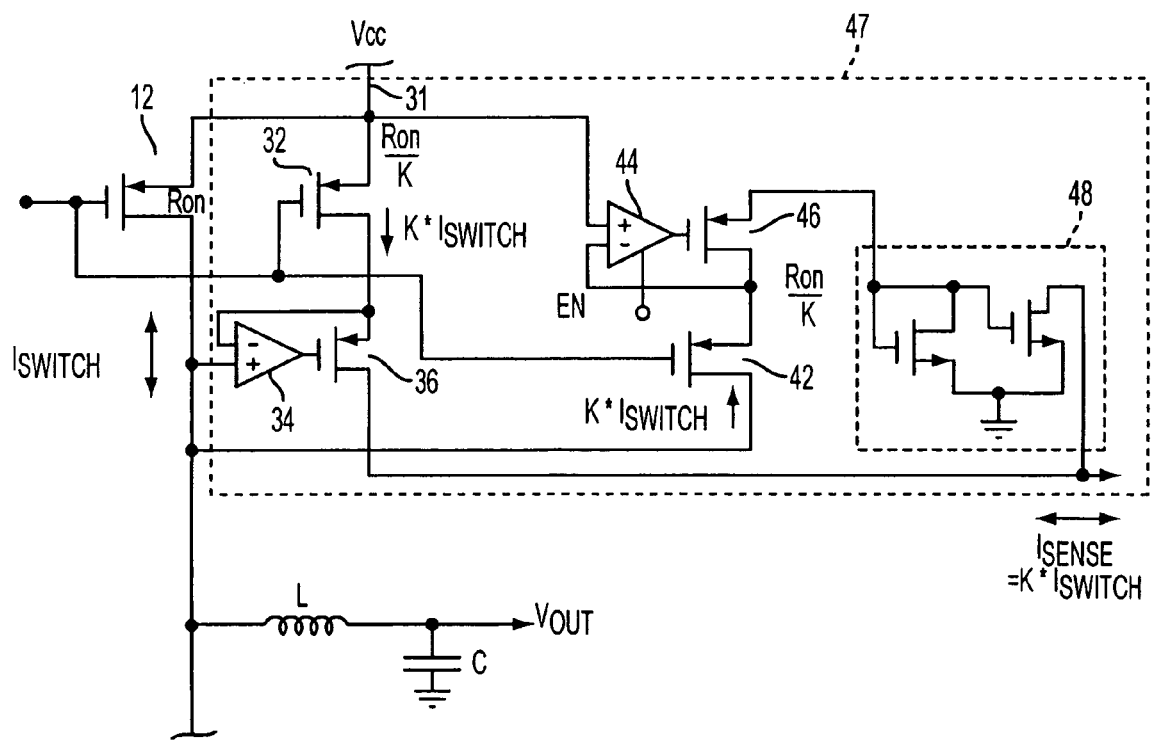
FIG. 4 illustrates an exemplary embodiment of the present invention, which allows for monitoring of both positive and negative currents in the high-side switch.

As noted above, the present invention provides for substantially loss-less sensing of the current flowing though the high-side switch in both a positive and negative direction. FIG. 4 illustrates an exemplary embodiment of the present invention. In comparison to the device illustrated in FIG. 3 and explained in further detail below, the present invention includes an additional replica device, which allows for sensing of the current flow in the negative direction. It is noted that only the components necessary to facilitate the understanding of the present invention are illustrated in FIG. 4. The components not shown in FIG. 4 are those components forming a typical current mode switching regulator (e.g., a low-side switch, controller, etc.).

Figure 1:
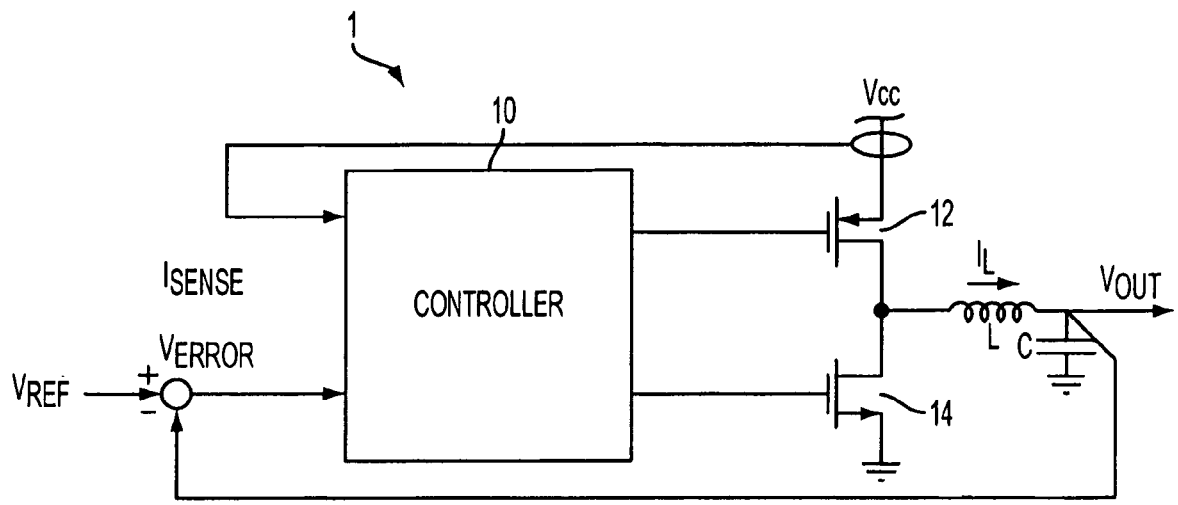
FIG. 1 illustrates an example of the use of a high-side switch in a prior art trailing edge modulation current mode switching regulator.
Figure 2:
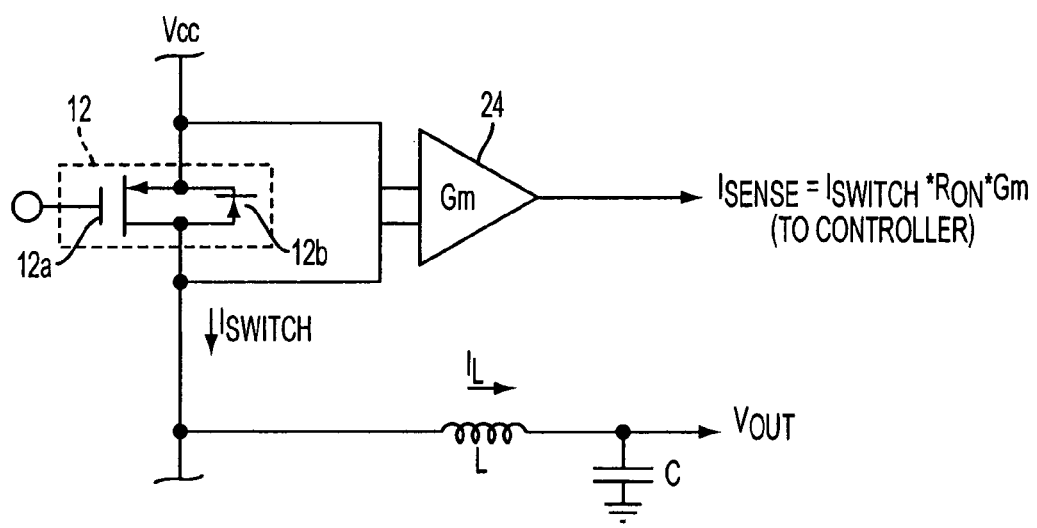
FIG. 2 illustrates a more detailed prior art version of the high-side switch 12 of FIG. 1 in a current mode switching regulator.

Referring to FIG. 4, the circuit includes the high-side switch 12, inductor L and load capacitor C coupled in the same manner as shown in FIG. 2. The circuit further also includes a first replica switch 32, a first sense amplifier 34 and a first auxiliary device 36, which are coupled within the circuit in essentially the same manner as shown in FIG. 3. The circuit also includes a second replica switch 42, a second sense amplifier 44, a second auxiliary device 46 and a current mirror circuit 48, which are coupled together in the following manner. The second replica switch 42, which in the given embodiment is a PMOS switch, is configured to receive the same signal at its gate terminal as the drive signal applied to the gate terminal of the high-side switch 12. As shown, the drain terminal of both the second replica device 42 and the high-side switch 12 are coupled to the inductor L and the low-side switch (not shown). The source of the second replica device 42 is coupled to the inverting terminal of the second sense amplifier 44 and the source terminal of the second auxiliary device 46, which is also a PMOS switch in the given embodiment. The non-inverting terminal of the second sense amplifier 44 is coupled to the supply voltage 31, and the output of the second sense amplifier 44 is coupled to the gate terminal of the second auxiliary device 46. The drain terminal of the second auxiliary device 46 is coupled to the current mirror circuit 48, which in the given embodiment includes two NMOS transistors coupled together in the manner illustrated in FIG. 4. The remaining components illustrated in FIG. 4 are coupled in the same manner as discussed above in conjunction with FIG. 3. It is noted that the circuitry illustrated in FIG. 4 represents an exemplary embodiment of the present invention, and as would be appreciated by those of skill in the art, variations in the specific implementation are clearly possible.

Figure 5:
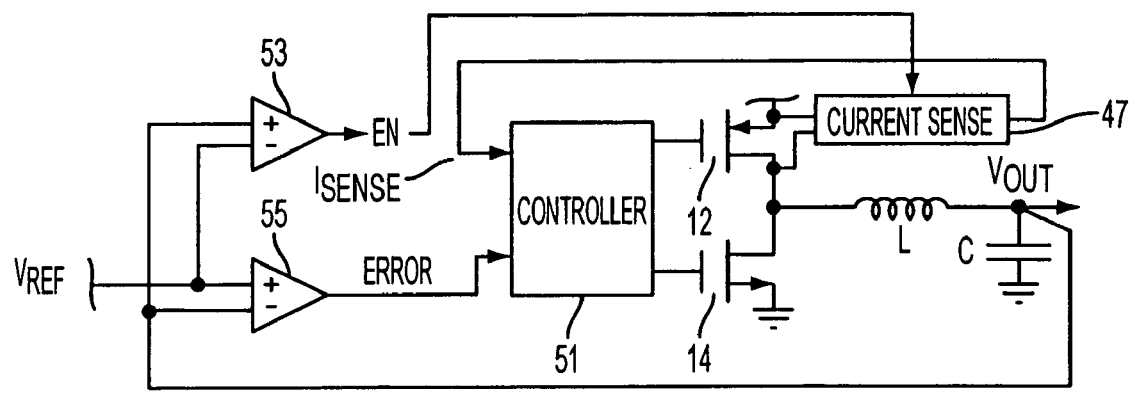
FIG. 5 illustrates a second exemplary embodiment of the present invention in which the current sensing circuit of FIG. 4 is utilized in a current mode switching regulator.

The operation of the device illustrated in FIG. 4 is as follows. When $I_{SWITCH}$ is positive (i.e., current flowing from $V_{SUPPLY}$ to the load), both the high-side switch 12 and the first replica switch are "ON". Further, the drain-to-source voltage of the high-side switch 12 (also referred to as the main switch) and the first replica device 32 are essentially the same, which results in the inputs to the first sense amplifier 34 being substantially equal (or the inverting terminal being slightly more positive than the non-inverting terminal). This causes the sense amplifier 34 to output a low level signal which functions to turn on the auxiliary device 36, and the auxiliary device 36 outputs the $I_{SENSE}$ signal. Thus, when $I_{SWITCH}$ is positive, $I_{SENSE}$, which is a scaled version of $I_{SWITCH}$, is flowing through the first replica device 32 and the auxiliary device 36. It is noted that, as shown in FIG. 5, the $I_{SENSE}$ signal is coupled to a controller which governs the overall operation of the switching regulator.

During this period of positive current flow, as explained in further detail below, the controller (not shown in FIG. 4) operates to disable the second sense amplifier 44 by providing a low level signal to the disable/enable terminal of the second sense amplifier 44. As a result, the second auxiliary device 46 is turned off (i.e., the switch is open) and no current flows through the second auxiliary device 46 or the second replica device 42 during the period of the positive current flow. Further, as the second sense amplifier 44 is disabled during this period, an additional power savings is obtained. The transistors contained in the current mirror circuit 48 are also off when current is flowing in the positive direction.

It is noted that even if the second sense amplifier 44 was not disabled during periods of positive current flow via the signal forwarded by a controller, the configuration of the second sense amplifier 44 within the circuit results in the second replica switch 42 being open during this period. More specifically, when $I_{SWITCH}$ is positive, the non-inverting terminal of the second sense amplifier 44 is more positive than the inverting terminal of the second sense amplifier 44, and as a result, the second sense amplifier 44 outputs a signal which functions to turn off (i.e., open) the second auxiliary device 46. As is clear from the circuit, when the second auxiliary device 46 is open, there is no current flow through the second replica device 42 or the current mirror circuit 48.

Thus, when $I_{SWITCH}$ is positive, a scaled version of $I_{SWITCH}$ flows to $I_{SENSE}$ via the first replica device 32 and the first auxiliary device 36.

In contrast, when $I_{SWITCH}$ is negative (i.e., current flowing from the load back to the supply), the node in common with the drain of the main switch 12 and the inductor L becomes more positive relative to the supply voltage 31. As a result, the non-inverting terminal of the first sense amplifier 34 is more positive than the inverting terminal, which results in the first sense amplifier 34 outputting a high level signal. This causes the first auxiliary device 36 to turn off, which prevents current flowing through the first replica device 32.

However, at this time, the inverting terminal of the second sense amplifier 44 is more positive than the non-inverting terminal, which results in the second sense amplifier 44 outputting a low level signal. This low level signal causes the second auxiliary device 46 to turn on, thereby allowing current to flow through the second replica switch 42. As a result, when $I_{SWITCH}$ is negative, a scaled version of $I_{SWITCH}$ flows into the current mirror circuit 48.

The current mirror circuit 48, which in the given embodiment comprises two NMOS transistors, functions to invert the polarity of the current signal input into the current mirror circuit 48. The output of the current mirror circuit 48 represents $I_{SENSE}$ and is the scaled version of $I_{SWITCH}$. It is noted that in the preferred embodiment, both the first replica device 32 and the second replica device 42 are formed so as to have the same scaling factors.

As is clear from the foregoing description, the device illustrated in FIG. 4 and described above allows for accurate monitoring of either polarity of high-side switch current, and provides a scaled version of that current on the $I_{SENSE}$ signal line. Moreover, the foregoing circuit provides sensing of the current flowing through the high-side switch in a substantially loss-less manner, as the sensing is performed utilizing much smaller MOS devices as the sensing elements conducting smaller currents than the main switch and not increasing the voltage drop across the switch as would be the case if a series sense resistor was utilized.

FIG. 5 illustrates a second exemplary embodiment of the present invention in which the current sensing circuit 47 of FIG. 4 is utilized in a current mode switching regulator. Referring to FIG. 5, which illustrates a block diagram of the current mode switching regulator, the regulator includes a controller 51, a high-side switch 12, a low-side switch 14, an inductor L and load capacitor C, an error comparator 53 and an error amplifier 55.

More specifically, the high-side switch 12, the low-side switch 14, the inductor L, and the load capacitor C are coupled in the standard configuration utilized in current mode switching regulators as shown in FIG. 5. The current sensing circuit 47 is coupled across the drain and source terminals of the high-side switch 12 in the same manner as illustrated in FIG. 4. The output of the current sensing circuit 47, which is $I_{SENSE}$, is coupled to the controller 51 as an input signal. The output voltage signal, $V_{OUT}$, which is the voltage across the load capacitor C, is fedback as an input signal to both the error comparator 53 and the error amplifier 55. As shown, the feedback signal is coupled to the inverting terminal of the error amplifier 55, and to the non-inverting terminal of the error comparator 53. A reference voltage, $V_{REF}$, is coupled to the non-inverting terminal of the error amplifier 55 and to the inverting terminal of the error comparator 53. The output of the error comparator 53 provides a control signal for enabling and disabling the second sense amplifier 44 contained in the current sense circuit 47. The output of the error amplifier 55 is coupled to the controller 51 as an input signal. The controller 51 functions to govern the operation of the switching regulator, including the activation and deactivation of the high-side switch 12 and the low-side switch 14. As is known to those of skill in the art, in an actual current mode switching regulator, there would be additional inputs and outputs to and from the controller, as well as additional circuitry. However, these additional components and signal lines are omitted from this discussion so as to facilitate understanding of the present invention.

With regard to the operation of the device illustrated in FIG. 5, the error comparator 53 functions to monitor the difference between $V_{OUT}$ and $V_{REF}$, and enable the second sense amplifier 44 only when $V_{OUT}$ is greater than $V_{REF}$. More specifically, in the given embodiment the error comparator 53 generates a logic control signal that enables the second sense amplifier 44 when $V_{OUT}$ is greater than $V_{REF}$, and generates the opposite logic signal when $V_{OUT}$ is less than $V_{REF}$ so as to disable the second sense amplifier 44. As such, the error comparator 53 effectively generates a signal which indicates the direction (i.e., polarity) of the current flowing through the high-side switch 12. In the given embodiment, the error comparator 53 generates a logic high signal when a negative current is flowing through the high-side switch 12 and generates a logic low signal when a positive current is flowing through the high-side switch 12.

It is noted that $V_{REF}$ represents the set point or the desired output voltage level. As such, this voltage can be variable, and is typically set by the controller 51. The error amplifier 55 functions to generate an analog signal which indicates the difference between $V_{OUT}$ and $V_{REF}$. It is also noted that the inductor current is negative only when $V_{OUT}$ is greater than $V_{REF}$. Finally, it is again noted that by enabling the second sense amplifier 44 only when a negative current is flowing results in both power savings and improved efficiency for the device.

Figure 6:
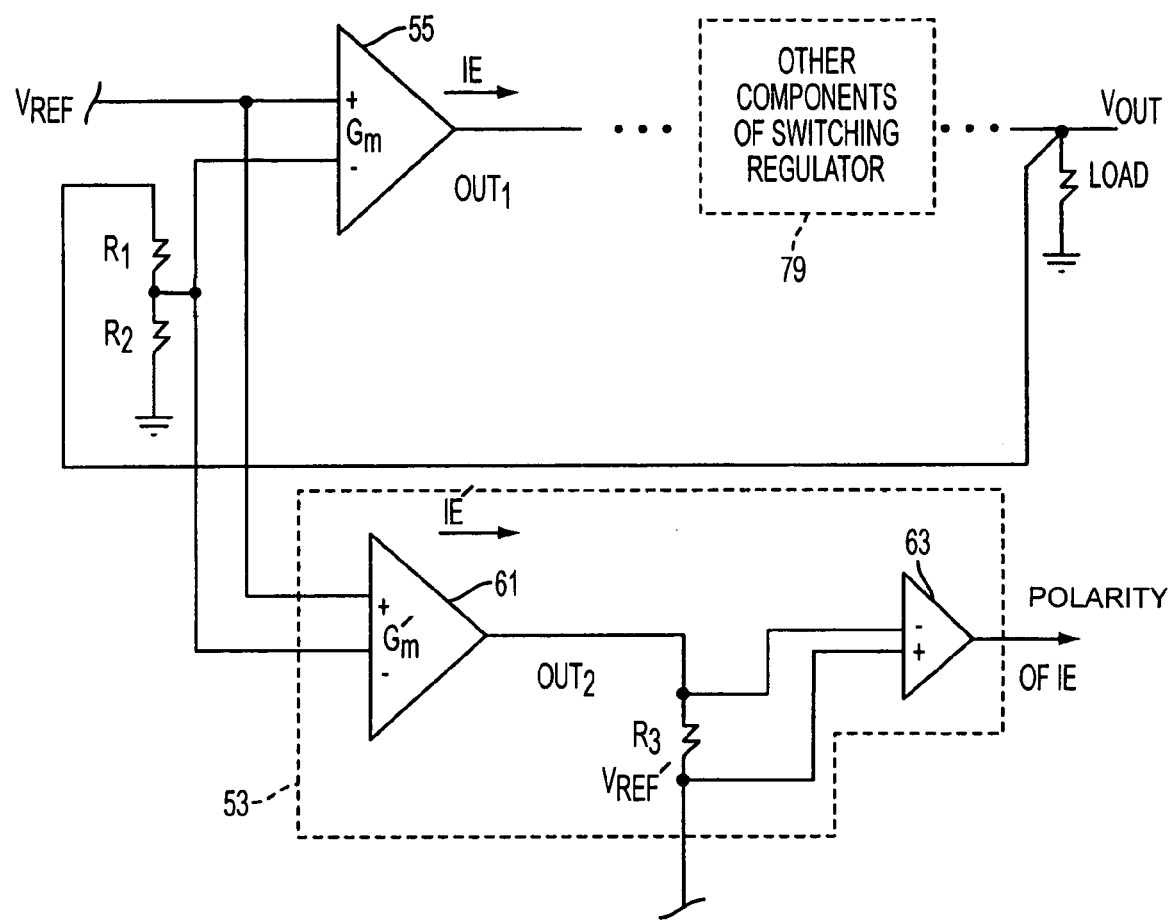
FIG. 6 illustrates an exemplary circuit diagram of the feedback loop utilized in the current mode switching regulator shown in FIG. 5.

FIG. 6 illustrates an exemplary circuit diagram of the feedback loop utilized in the current mode switching regulator shown in FIG. 5. More specifically, FIG. 6 illustrates an exemplary embodiment of the error amplifier 55 and the error comparator 53 illustrated in FIG. 5. Referring to FIG. 6, the error amplifier 55 comprises a first amplifier 55, the output of which is an analog signal representing the difference between $V_{OUT}$ and $V_{REF}$. The error comparator 53 comprises a second amplifier 61 having $V_{REF}$ coupled to the non-inverting input terminal and $V_{OUT}$ coupled the inverting input terminal. It is noted that $V_{OUT}$ is coupled to the inverting terminals via the voltage divider circuit formed by resistors $R_1$ and $R_2$. As an example, the value of $V_{REF}$ can be fixed at a band gap or 1.2 v, in which case $V_{OUT}$ is divided to the same level. The error comparator 53 further comprises a comparator 63 which receives the output signal from the second amplifier 61 as an input signal to its inverting terminal and $V_{REF}'$ as an input signal to its non-inverting terminal. Resistor $R_3$ is also coupled across the inverting and non-inverting input terminals of the comparator 63. The output of the comparator 63 is a logic signal which indicates the polarity of the current flow through the high-side switch 12. As noted above, this signal is utilized to enable/disable the second sense amplifier 44. It is noted that the block diagram of FIG. 6 omits the other components 79 of the switching regulator from the drawing to facilitate the understanding of the foregoing portion of the device.

Thus, the signal from the second amplifier 61 can be utilized to determine the polarity of the current flowing through the high-side switch 12 without affecting the error signal, $I_E$, produced by the first amplifier 55. It is also noted that by locating the second amplifier 61 ahead of the comparator 63, the voltage offset of the comparator 63 is attenuated by the transconductance factor Gm' of the second amplifier $61 \times R_3$, thereby making it effectively negligible.

Figure 7:
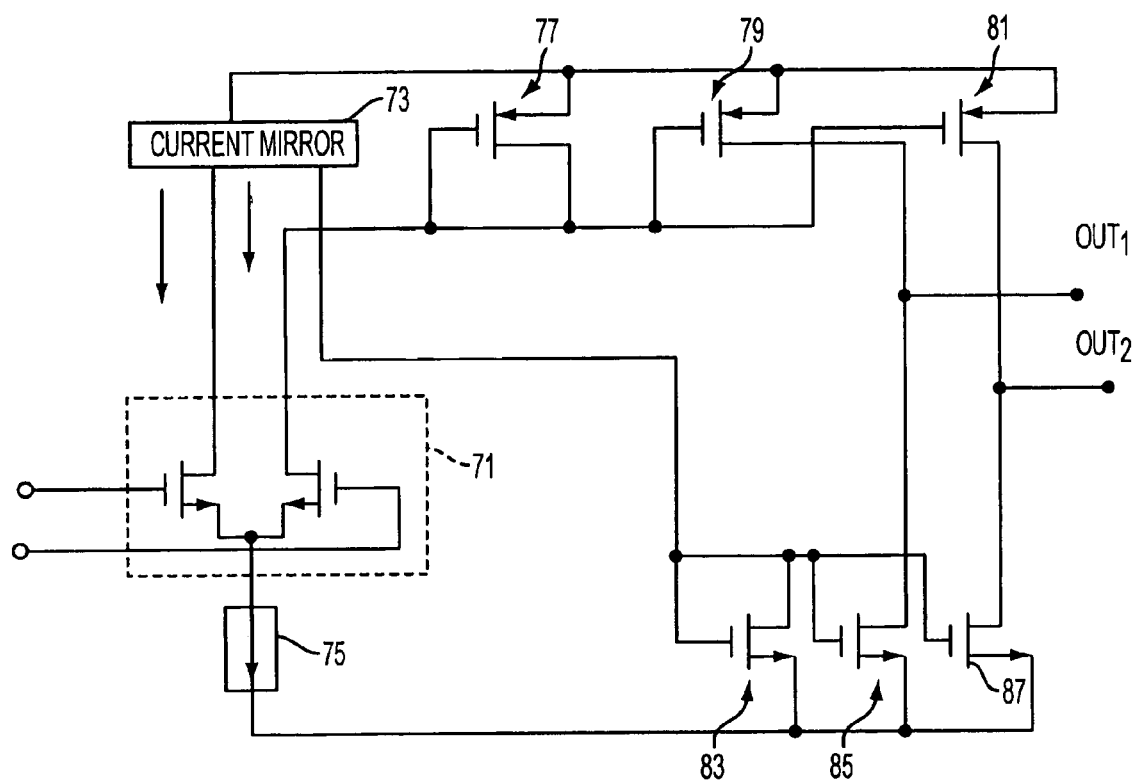
FIG. 7 illustrates an exemplary implementation of a circuit allowing for matching of the transconductance amplifiers illustrated in FIG. 6.

FIG. 7 illustrates an exemplary implementation of a circuit allowing for matching of the first and second transconductance amplifiers 55 and 61 illustrated in FIG. 6. If the first amplifier 55 and the second amplifier 61 are implemented as a single amplifier with one input and two identical outputs as shown in FIG. 7, the only critical match required is between the PMOS and NMOS final output stages. However, this is relatively easy to accomplish due to the small number of identical devices that are necessary and the relatively high level signals at this point of processing within the circuit.

Referring to FIG. 7, the circuit includes an input stage comprising a differential amplifier input 71 formed by two NPN transistors, a current mirror circuit 73, and a current source 75. It is noted that the current mirror circuit can be implemented with PNP or PMOS transistors, or alternatively, more complex current mirror circuits can be utilized. The circuit further includes two output stages formed by three PMOS transistors 77, 79 and 81 and three NMOS transistors 83, 85 and 87 coupled together in the manner illustrated in FIG. 7. The first output is one of the nodes where a PMOS and NMOS drain are connected, and the second output is the other node where a PMOS and NMOS drain are connected, as shown in FIG. 7. Referring to FIGS. 6 and 7, OUT1 corresponds to the output of the first amplifier 55, and OUT2 corresponds to the output of second amplifier 61.

Thus, in the circuit of FIG. 7, as there is only one input stage, the offsets and Gm differences of the two outputs are substantially nonexistent, and the overall matching of Gm is significantly improved over the separate amplifier embodiment shown in FIG. 6. In addition, there is reduced input loading due to the single input stage. Furthermore, an accurate sensing of the current in the loop filter by monitoring output 2 in a resistor referenced to ground through $V_{REF}'$ is easier and does not disturb or couple noise into output 1.

It is noted that this dual output configuration is ideal for obtaining both the enable signal for controlling the negative current sense amplifier 44 and the actual deviation of $V_{OUT}$ from the set point, $V_{REF}$, without requiring a direct measurement of either the $V_{OUT}$ or the loop filter current, $I_E$. As a result, the circuit improves the accuracy of the controller, as well as the current sense circuits.

As discussed above, the switching regulator of the present invention provides numerous advantages over the prior art. One advantage of the present invention is that it provides for substantially loss-less sensing of the current flowing in the high-side switch regardless of whether the current is flowing in a positive or negative direction. It is noted that the current sensing is performed in a substantially "loss less" manner because the sensing element utilizes a small scaled MOS transistor in parallel with the main switch as a sensing element, rather than a discrete resistor that is in series with the switch, which would result in an undesirable increase in voltage drop and power dissipation.

Another advantage of the present invention is that it provides for improved efficiency as the current mode switching regulator allows for the sense amplifier associated with measuring negative current flow to be disabled during periods of positive current flow.

Yet another advantage is that the current mode switching regulator of the present invention provides a means of accurately measuring the peak inductor current at a single point internal to an integrated circuit (i.e., the high-side driver) without a sense resistor (which would need to be external) and its losses or the power losses of an always on negative current sensor which is seldom needed in usual operation having no large transient changes in the load or programmed load voltage.

While specific embodiments of, and examples for, the invention are described herein for illustrative purposes, various equivalent modifications are possible within the scope of the invention, as those skilled in the relevant art will recognize.

Furthermore, the terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A current sensing circuit for use in a switching regulator having a high-side switch, said current sensing circuit comprising:
   a first sensing circuit coupled to said high-side switch for measuring current flowing in a positive direction through said high-side switch, said first sensing circuit including a first replica device for generating a current which is a scaled version of said positive current flowing through said high-side switch, and
   a second sensing circuit coupled to said high-side switch for measuring current flowing in a negative direction through said high-side switch, said second sensing circuit including a second replica device for generating a current which is a scaled version of said negative current flowing through said high-side switch.

2. The current sensing circuit of claim 1, wherein said first sensing circuit further includes a first sense amplifier and a first auxiliary device, said first sense amplifier controlling the operational state of said first auxiliary device so as to activate said first auxiliary device when a positive current is flowing through said high-side switch so as to allow the scaled version of said positive current generated by said first replica device to be output by said current sensing circuit, and
   said second sensing circuit further includes a second sense amplifier and a second auxiliary device, said second sense amplifier controlling the operational state of said second auxiliary device so as to activate said second auxiliary device when a negative current is flowing through said high-side switch so as to allow the scaled version of said negative current generated by said second replica device to be output by said current sensing circuit.

3. The current sensing circuit of claim 2, wherein said current sensing circuit further comprises:
   a current mirror circuit coupled to second auxiliary device, said current mirror operative for inverting the polarity of the scaled current signal generated by said second replica device prior to said scaled current signal being output by said current sensing circuit.

4. The current sensing circuit of claim 2, wherein each of said first replica device, said first auxiliary device, said second replica device and said second auxiliary device comprises a MOS transistor.

5. The current sensing circuit of claim 4, wherein a gate terminal of said high-side switch, a gate terminal of said first replica device and a gate terminal of said second replica device are coupled together so as to receive the same drive signal.

6. The current sensing circuit of claim 2, wherein said second sense amplifier is disabled during periods of positive current flow through side high-side switch.

7. A switching regulator for regulating an output voltage, said switching regulator comprising:
   a high-side switch;
   a low-side switch;
   a controller coupled to said high-side switch and said low-side switch, said controller governing the operational state of said high-side switch and said low-side switch during operation of said switching regulator; and
   a current measuring circuit including:
      a first sensing circuit coupled to said high-side switch for measuring current flowing in a positive direction through said high-side switch, said first sensing circuit including a first replica device for generating a current which is a scaled version of said positive current flowing through said high-side switch, and
      a second sensing circuit coupled to said high-side switch for measuring current flowing in a negative direction through said high-side switch, said second sensing circuit including a second replica device for generating a current which is a scaled version of said negative current flowing through said high-side switch.

8. The switching regulator according to claim 7, wherein said first sensing circuit further includes a first sense amplifier and a first auxiliary device, said first sense amplifier controlling the operational state of said first auxiliary device so as to activate said first auxiliary device when a positive current is flowing through said high-side switch so as to allow the scaled version of said positive current generated by said first replica device to be output by said current sensing circuit, and
   said second sensing circuit further includes a second sense amplifier and a second auxiliary device, said second sense amplifier controlling the operational state of said second auxiliary device so as to activate said second auxiliary device when a negative current is flowing through said high-side switch so as to allow the scaled version of said negative current generated by said second replica device to be output by said current sensing circuit.

9. The switching regulator according to claim 8, wherein said current sensing circuit further comprises:
   a current mirror circuit coupled to second auxiliary device, said current mirror operative for inverting the polarity of the scaled current signal generated by said second replica device prior to said scaled current signal being output by said current sensing circuit.

10. The switching regulator according to claim 8, wherein each of said first replica device, said first auxiliary device, said second replica device and said second auxiliary device comprises a MOS transistor.

11. The switching regulator according to claim 10, wherein a gate terminal of said high-side switch, a gate terminal of said first replica device and a gate terminal of said second replica device are coupled together so as to receive the same drive signal.

12. The switching regulator according to claim 8, wherein said second sense amplifier is disabled during periods of positive current flow through side high-side switch.

13. The switching regulator of claim 8, further comprising an error comparator, said error comparator operative for generating a logic signal which indicates whether current is flowing in a positive or negative direction through said high-side switch.

14. The switching regulator of claim 13, wherein said logic signal generated by said error comparator is utilized to enable said second sense amplifier when a negative current is flowing through said high-side switch.

15. The switching regulator of claim 7 further comprising an error comparator and an error amplifier, said error comparator having an output coupled to said second sensing circuit and operative for generating a control signal for enabling and disabling said second sense circuit, said error amplifier having an output coupled to said controller and operative for generating an output signal indicating the difference between said output voltage and a reference voltage.

16. The switching regulator of claim 15, said error comparator and said error amplifier are formed utilizing a circuit comprising a differential amplifier, a current source and a current mirror, which are operative as an input stage of said circuit, said circuit further comprising a plurality of PMOS transistors coupled in a parallel configuration and a plurality of NMOS transistors coupled in a parallel configuration;

said plurality of PMOS transistors each having a gate terminal coupled to an output of said differential amplifier;

said plurality of NMOS transistors each having a gate terminal coupled to an output of said current mirror;

wherein a drain terminal of a first one of said plurality of PMOS transistors is coupled to a drain terminal of a first one of said plurality of NMOS transistors so as to form a first output, and a drain terminal of a second one of said plurality of PMOS transistors is coupled to a drain terminal of a second one of said plurality of NMOS transistors so as to form a second output.

* * * * *

UNITED STATES PATENT AND TRADEMARK OFFICE
CERTIFICATE OF CORRECTION

PATENT NO. : 7,282,894 B2  Page 1 of 1
APPLICATION NO. : 11/207937
DATED : October 16, 2007
INVENTOR(S) : Richard Oswald et al.

It is certified that error appears in the above-identified patent and that said Letters Patent is hereby corrected as shown below:

On the title page item (54), and col. 1, line 1,

Change, "METHOD AND APPARATUS FOR PERFORMING LOSSLESS SENSING AND NEGATIVE INDUCTOR CURRENTS IN A HIGH SIDE SWITCH" to -- METHOD AND APPARATUS FOR PERFORMING LOSSLESS SENSING OF POSITIVE AND NEGATIVE INDUCTOR CURRENTS IN A HIGH SIDE SWITCH --

On the title page under item (56), References Cited, add

-- OTHER PUBLICATIONS

"OVERVIEW OF FEEDBACK CONTROL FOR CONVERTERS", pp. 600 – 606 --

Signed and Sealed this

Twenty-sixth Day of May, 2009

JOHN DOLL
*Acting Director of the United States Patent and Trademark Office*